United States Patent
Hu

(10) Patent No.: US 9,951,410 B2
(45) Date of Patent: Apr. 24, 2018

(54) INFRARED SURFACE LIGHT SOURCE GENERATING DEVICE AND METHOD OF MANUFACTURING SAME

(71) Applicant: H&H-T CO., LTD., Taipei (TW)

(72) Inventor: Chuan Ling Hu, New Taipei (TW)

(73) Assignees: H&H-T CO., LTD., Taipei (TW); Chuan Ling Hu, New Taipei (TW)

( * ) Notice: Subject to any disclaimer, the term of this patent is extended or adjusted under 35 U.S.C. 154(b) by 245 days.

(21) Appl. No.: 14/836,939

(22) Filed: Aug. 26, 2015

(65) Prior Publication Data

US 2016/0060753 A1    Mar. 3, 2016

(30) Foreign Application Priority Data

Aug. 26, 2014  (TW) .............................. 103129429 A

(51) Int. Cl.
| | |
|---|---|
| *B32B 3/24* | (2006.01) |
| *C23C 14/06* | (2006.01) |
| *C23C 14/34* | (2006.01) |
| *H05B 3/20* | (2006.01) |
| *H05B 3/14* | (2006.01) |
| *H05B 3/26* | (2006.01) |
| *C23C 14/02* | (2006.01) |
| *B82Y 20/00* | (2011.01) |

(52) U.S. Cl.
CPC ........ *C23C 14/0605* (2013.01); *C23C 14/025* (2013.01); *C23C 14/34* (2013.01); *H05B 3/14* (2013.01); *H05B 3/145* (2013.01); *H05B 3/20* (2013.01); *H05B 3/26* (2013.01); *B82Y 20/00* (2013.01); *Y10T 428/24331* (2015.01)

(58) Field of Classification Search
CPC .......................... H05B 3/14; Y10T 428/24331
See application file for complete search history.

(56) References Cited

U.S. PATENT DOCUMENTS

| | | | |
|---|---|---|---|
| 2011/0042589 A1* | 2/2011 | Norwood ................ | C23C 14/00 250/493.1 |
| 2012/0235067 A1* | 9/2012 | Araci ..................... | B82Y 20/00 250/504 R |
| 2016/0249412 A1* | 8/2016 | Romanov ................ | H05B 3/14 |

* cited by examiner

*Primary Examiner* — William P Watkins, III
(74) *Attorney, Agent, or Firm* — Rabin & Berdo, P.C.

(57) ABSTRACT

An infrared surface light source generating device includes a substrate layer and a carbon material layer formed on a surface of the substrate layer and having a sheet resistance value ranged between 0.01 and 1000Ω/□. The carbon material layer is able to emit far infrared rays when it is heated by an amount of external low-power energy to a temperature above 36° C. A method of manufacturing the above infrared surface light source generating device is also disclosed. The method includes the steps of (A) providing a substrate layer and (B) forming a carbon material layer that is located on a surface of the substrate layer and has a sheet resistance value ranged between 0.01 and 1000Ω/□. Since the method involves only a simplified manufacturing process, the infrared surface light source generating device can be manufactured at reduced cost.

8 Claims, 14 Drawing Sheets

Form a substrate layer

Form a carbon material layer on a surface of the substrate layer, and the carbon material layer has a sheet resistance value ranged between 0.01 and 1000Ω/□

```
┌─────────────────────────────────────────────┐
│      Provide an insulation substrate        │
└─────────────────────────────────────────────┘
```

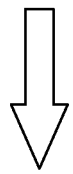

```
┌─────────────────────────────────────────────┐
│ Form a layer of bonding material on a       │
│ surface of the insulation substrate, and    │
│ the insulation substrate and the bonding    │
│ material together form a substrate layer    │
└─────────────────────────────────────────────┘
```

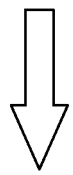

```
┌─────────────────────────────────────────────┐
│ Form a carbon material layer on a surface   │
│ of the substrate layer, and the carbon      │
│ material layer has a sheet resistance       │
│ value ranged between 0.01 and 1000Ω/□       │
└─────────────────────────────────────────────┘
```

FIG. 6

Form a substrate layer
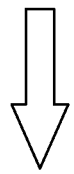
Form a carbon material layer on
a surface of the substrate layer
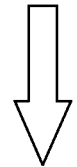
Perform a hole forming process to form at least one hole on the
carbon material layer, so that the carbon material layer has a
sheet resistance value ranged between 0.01 and 1000Ω/□
FIG. 8

INFRARED SURFACE LIGHT SOURCE GENERATING DEVICE AND METHOD OF MANUFACTURING SAME

FIELD OF THE INVENTION

The present invention relates to an infrared surface light source generating device, and more particularly to an infrared surface light source generating device that is able to emit far infrared rays without the need of any electric heating element. The present invention also relates to a method of manufacturing such infrared surface light source generating device.

BACKGROUND OF THE INVENTION

FIG. 1 schematically shows a conventional infrared light generator 1, which includes a substrate 11, an electric heating element 12 located on a top of the substrate 11 and capable of producing heat when being supplied with electric current, and an infrared emitting element 13 located on a top of the electric heating element 12 for absorbing heat energy and thereby emitting infrared rays. The infrared emitting element 13 includes an infrared paint composed of graphite and carbon black. The ratio of the graphite to the carbon black is ranged from 1:1 to 1:2.

According to the conventional infrared light generator 1, the infrared emitting element 13 must be located on the top of the electric heating element 12, and the graphite and the carbon black must be mixed to form the infrared emitting element 13. Therefore, the conventional infrared light generator 1 has a relatively complicate structure and the manufacture thereof involves a complicated manufacturing process, which inevitably increase the manufacturing cost of the infrared light generator 1.

In view of the disadvantages of the conventional infrared light generator 1, it is desirable to develop an improved infrared surface light source generating device, which is able to emit far infrared rays when being heated by an amount of external low-power energy without the need of using any electric heating element and can be manufactured with a simplified and economical process.

SUMMARY OF THE INVENTION

A primary object of the present invention is to provide an infrared surface light source generating device that is able to emit far infrared rays without the need of any additional electric heating element. The device includes a carbon material layer that is able to emit far infrared rays when being heated by an amount of external low-power energy, even if the device does not include any electric heating element; and the device can be manufactured without the need of applying an infrared paint or mixing ceramic powder with graphite powder. Further, the infrared surface light source generating device provided according to the present invention has excellent infrared emissivity, particularly in the far infrared region.

Another object of the present invention is to provide a method of manufacturing the above infrared surface light source generating device. The method adopts simplified manufacturing process and uses easily available materials to make the infrared surface light source generating device, enabling the device to have reduced manufacturing cost and largely increased industrial applicability.

To achieve the above and other objects, the infrared surface light source generating device provided according to the present invention includes a substrate layer and a carbon material layer. The carbon material layer is formed on a surface of the substrate layer and has a sheet resistance value ranged between 0.01 and 1000Ω/□, such that the carbon material layer is able to emit far infrared rays when it is heated by an amount of external energy.

In a first embodiment of the present invention, the carbon material layer has a thickness smaller than 1 μm to obtain the sheet resistance value ranged between 0.01 and 1000Ω/□.

In a second embodiment of the present invention, the carbon material layer is formed with at least one hole to obtain the sheet resistance value ranged between 0.01 and 1000Ω/□.

In a third embodiment of the present invention, there is a layer of bonding material provided between the substrate layer and the carbon material layer.

The bonding material can be at least one metal material selected from the group consisting of titanium, nickel, chrome, and any alloy thereof. Or, the bonding material can be an adhesive.

To achieve the above and other objects, the method of manufacturing infrared surface light source generating device according to a first embodiment of the present invention includes the steps of (A) forming a substrate layer; and (B) forming a carbon material layer on a surface of the substrate layer, and the carbon material layer having a sheet resistance value ranged between 0.01 and 1000Ω/□.

The carbon material layer can be formed through sputter deposition, vacuum vapor deposition, plasma chemical vapor deposition, or graphite sheet lamination.

The carbon material layer has a thickness smaller than 1 μm to obtain the sheet resistance value ranged between 0.01 and 1000Ω/□.

In a second embodiment of the method according to the present invention, a hole forming process is performed to form at least one hole on the carbon material layer to obtain the sheet resistance value ranged between 0.01 and 1000Ω/□.

The hole forming process can be ultrasonic machining, electron beam machining, laser machining, hydraulic punching, conventional drilling, plastic hole forming, or chemical etching.

In a third embodiment of the method according to the present invention, the step (A) includes the sub-steps of providing an insulation substrate; and forming a layer of bonding material on a surface of the insulation substrate, so that the insulation substrate and the bonding material together form the substrate layer.

The bonding material can be at least one metal material selected from the group consisting of titanium, nickel, chrome, and any alloy thereof. Or, the bonding material can be an adhesive.

The infrared surface light source generating device of the present invention is characterized in that the carbon material layer is able to emit far infrared rays when it is heated by an amount of external energy, such as an electric source or a light source, to a temperature above 36° C. The method of manufacturing infrared surface light source generating device according to the present invention is characterized in using a simplified manufacturing process, in which a substrate layer is provided and then a carbon material layer is formed on a surface of the substrate layer to complete the infrared surface light source generating device. The device so manufactured is low in cost and has wide industrial applicability.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 6 is a flowchart showing the steps included in a variant of the first embodiment of the method of manufacturing infrared surface light source generating device according to the present invention;

FIG. 8 is a flowchart showing the steps included in a second embodiment of the method of manufacturing infrared surface light source generating device according to the present invention;

DETAILED DESCRIPTION OF THE PREFERRED EMBODIMENTS

Figure 1:
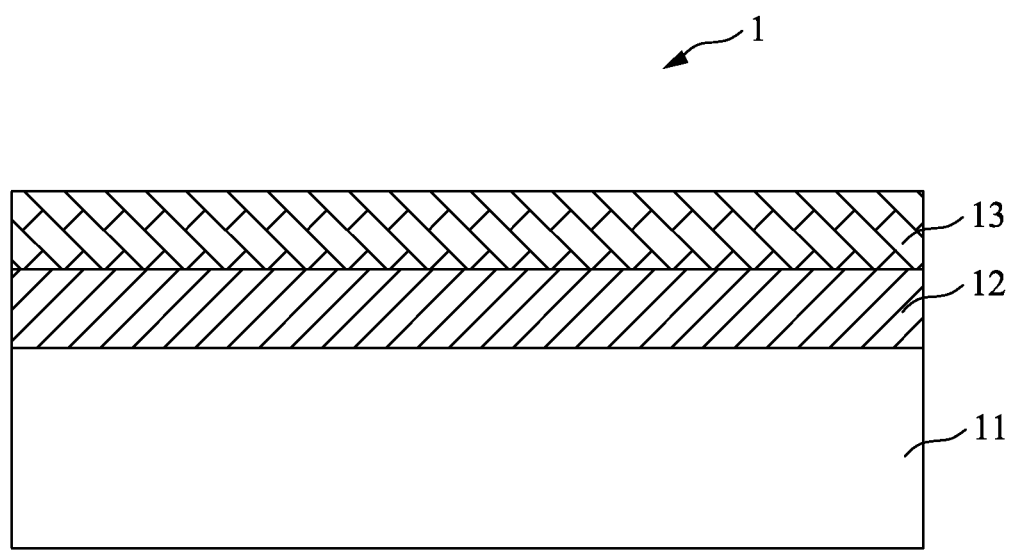
FIG. 1 is a schematic sectional view showing the structure of a conventional infrared light generator.

The present invention will now be described with some preferred embodiments thereof and by referring to the accompanying drawings. For the purpose of easy to understand, elements that are the same in the preferred embodiments are denoted by the same reference numerals.

Figure 2A:
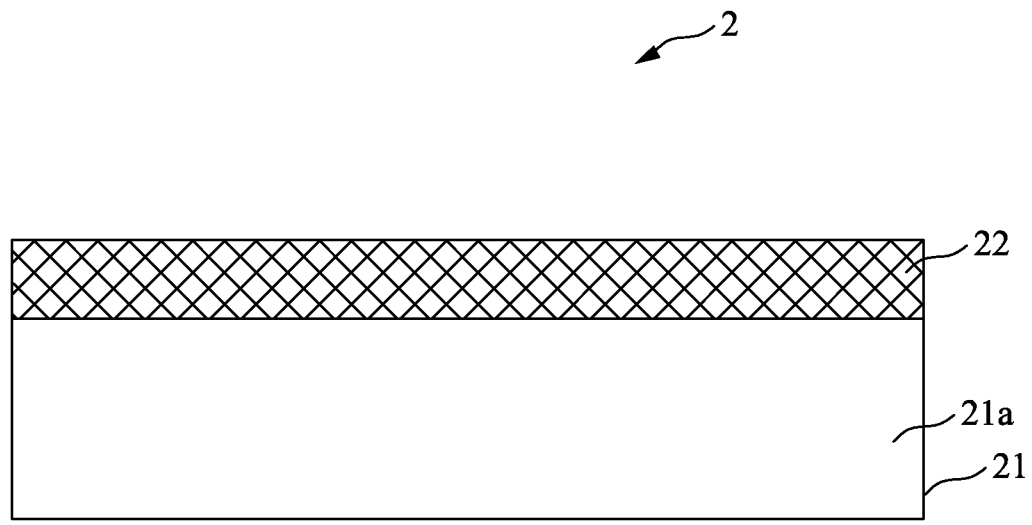
FIG. 2A is a schematic sectional view showing the structure of an infrared surface light source generating device according to a first embodiment of the present invention.
Figure 12:
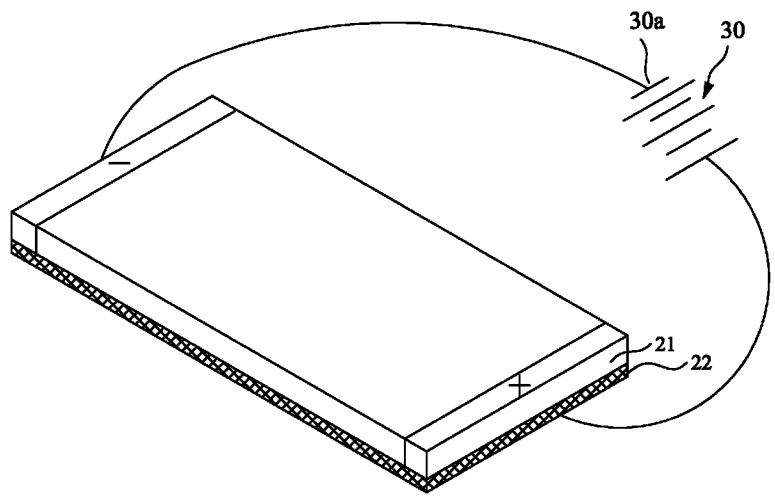
FIG. 12 illustrates a first manner of using the infrared surface light source generating device of the present invention.
Figure 13:
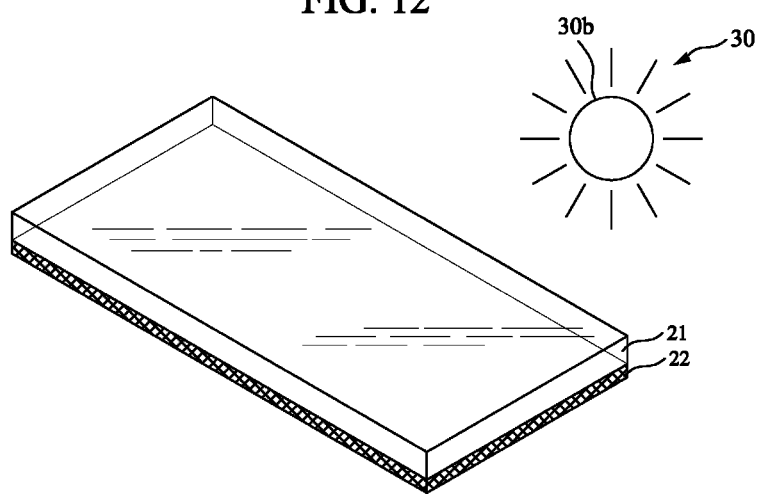
FIG. 13 illustrates a second manner of using the infrared surface light source generating device of the present invention.

Please refer to FIG. 2A, which is a schematic sectional view showing the structure of an infrared surface light source generating device according to a first embodiment of the present invention. For the purpose of conciseness and clarity, the present invention is also briefly referred to as the device and generally denoted by reference numeral 2 herein. As shown in FIG. 2A, the device 2 includes a substrate layer 21 formed of an insulation substrate 21a and a carbon material layer 22 formed of a pure carbon material. The carbon material layer 22 is so structured that it has a thickness smaller than 1 μm and a sheet resistance value ranged between 0.01 and 1000Ω/□. The sheet resistance is adjustable by controlling a film thickness of the carbon material layer 22. Further, when an amount of external energy 30 is applied to the device 2 to heat the carbon material layer 22 to a temperature higher than 36° C., the carbon material layer 22 is able to emit far infrared rays. The external energy 30 can be an electric source 30a, as shown in FIG. 12, or a light source 30b, as shown in FIG. 13.

Figure 2B:
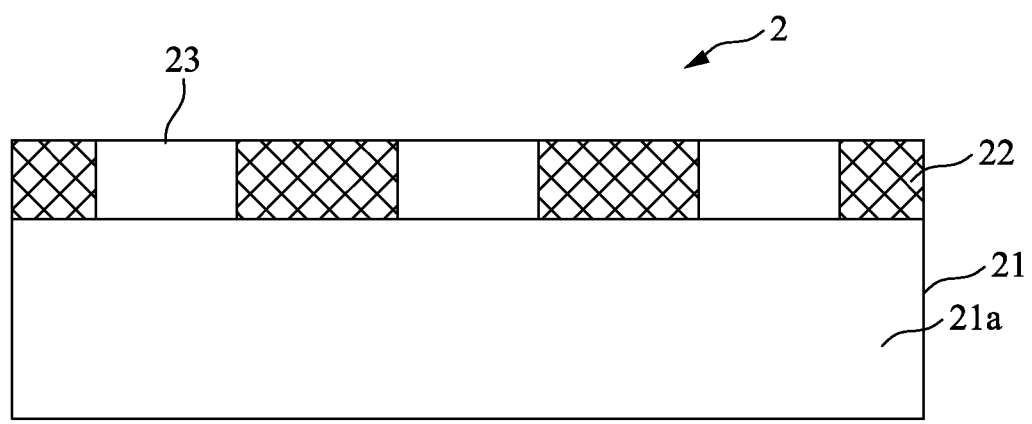
FIG. 2B is a schematic sectional view showing the structure of an infrared surface light source generating device according to a second embodiment of the present invention.

FIG. 2B is a schematic sectional view showing the structure of the infrared surface light source generating device 2 according to a second embodiment of the present invention. In the second embodiment, the device 2 includes a substrate layer 21 and a carbon material layer 22 formed with at least one hole 23. The hole or holes 23 are formed on the carbon material layer 22 to increase the internal sheet resistance of the carbon material layer 22, so as to obtain a sheet resistance value ranged between 0.01 and 1000Ω/□. Similarly, when an amount of external energy 30 is applied to the device 2 to heat the carbon material layer 22 to a temperature higher than 36° C., the carbon material layer 22 is able to emit far infrared rays. The external energy 30 can be an electric source 30a, as shown in FIG. 12, or a light source 30b, as shown in FIG. 13.

The hole or holes 23 can be formed on the carbon material layer 22 by different ways, such as ultrasonic machining, electron beam machining, laser machining, hydraulic punching, conventional drilling, plastic hole forming, and chemical etching.

Figure 3A:
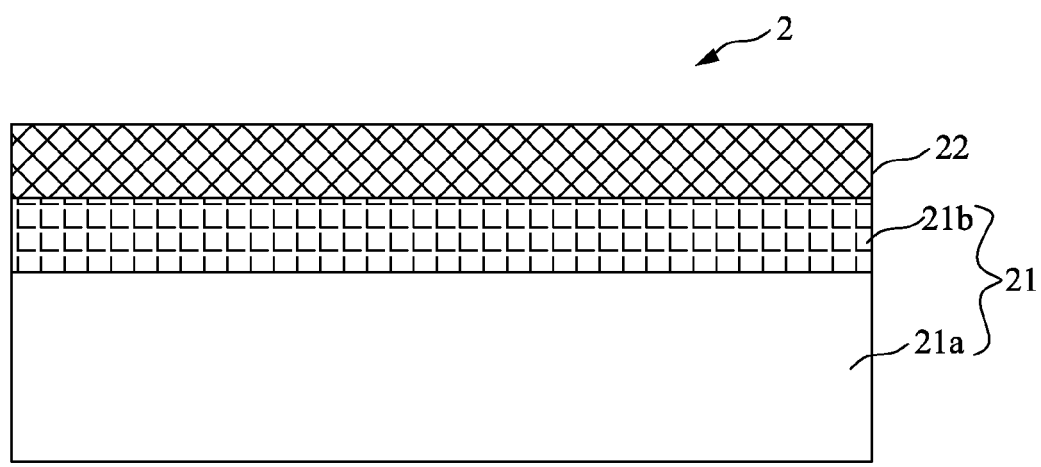
FIG. 3A is a schematic sectional view showing the structure of an infrared surface light source generating device according to a third embodiment of the present invention.

FIG. 3A is a schematic sectional view showing the structure of the infrared surface light source generating device 2 according to a third embodiment of the present invention. In the third embodiment, the device 2 includes a substrate layer 21 and a carbon material layer 22 having a thickness smaller than 1 μm. In addition to the insulation substrate 21a, the substrate layer 21 further includes a layer of bonding material 21b located between the insulation substrate 21a and the carbon material layer 22. The bonding material 21b can be at least one metal material selected from the group consisting of titanium, nickel and chrome and any alloy thereof. Or, the bonding material 21b can be an adhesive.

Figure 3B:
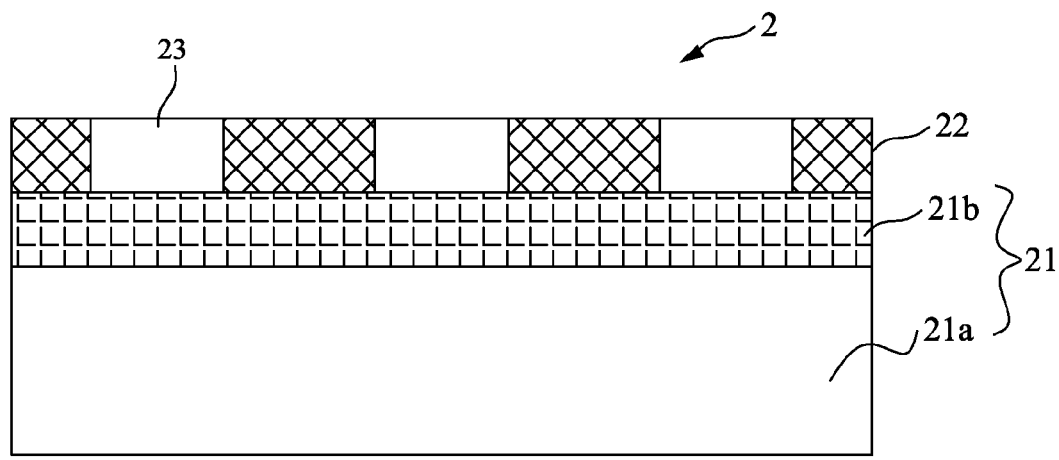
FIG. 3B is a schematic sectional view showing the structure of an infrared surface light source generating device according to a fourth embodiment of the present invention.

Please refer to FIG. 3B, which is a schematic sectional view showing the structure of the infrared surface light source generating device 2 according to a fourth embodiment of the present invention. In the fourth embodiment, the device 2 includes a substrate layer 21 and a carbon material layer 22 having a sheet resistance value ranged between 0.01 and 1000Ω/□. The carbon material layer 22 is formed with at least one hole 23, so as to obtain the sheet resistance value ranged between 0.01 and 1000Ω/□. In addition to the insulation substrate 21a, the substrate layer 21 further includes a layer of bonding material 21b located between the insulation substrate 21a and the carbon material layer 22. The bonding material 21b can be at least one metal material selected from the group consisting of titanium, nickel and chrome and any alloy thereof. Or, the bonding material 21b can be an adhesive.

The present invention also provides a method of manufacturing the aforesaid infrared surface light source generating device 2. Please refer to FIGS. 4 and 5, which are flowchart and pictorial description, respectively, of steps included in a first embodiment of the manufacturing method provided according to the present invention. As shown, in the first embodiment thereof, the manufacturing method includes the following steps: (A) forming a substrate layer 21; and (B) forming a carbon material layer 22 on a surface of the substrate layer 21 and making the carbon material layer 22 have a sheet resistance value ranged between 0.01 and 1000Ω/□.

The carbon material layer 22 can be formed through different processes, including but not limited to sputter deposition, vacuum vapor deposition, plasma chemical vapor deposition, and graphite sheet lamination.

Figure 4:
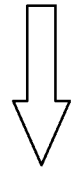
FIG. 4 is a flowchart showing the steps included in a first embodiment of a method of manufacturing infrared surface light source generating device according to the present invention.
Figure 5:
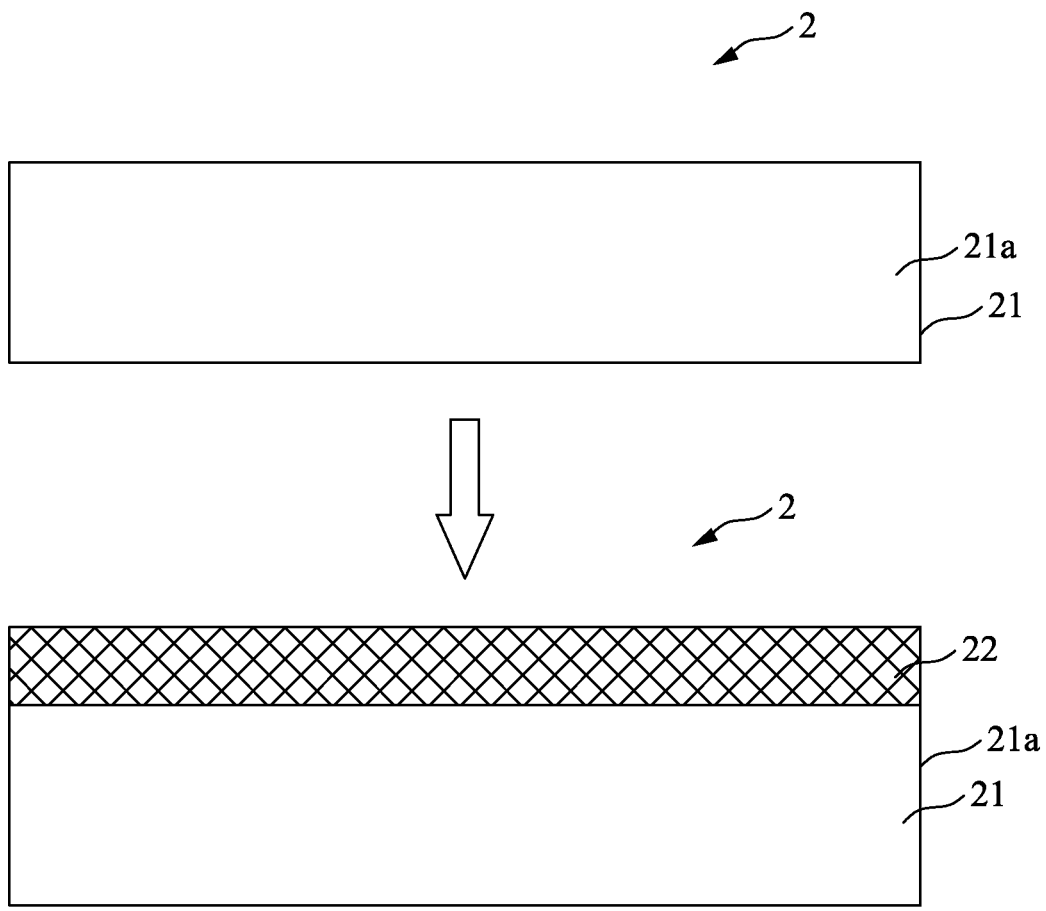
FIG. 5 is a pictorial description of the steps shown in FIG. 4.

As shown in FIGS. 4 and 5, according to the first embodiment of the manufacturing method of the present invention, the carbon material layer 22 formed on the surface of the substrate layer 21 in the step (B) has a thickness smaller than 1 μm, so that the carbon material layer 22 can have a sheet resistance value ranged between 0.01 and 1000Ω/□. Then, when an amount of external energy 30 is applied to the device 2 to heat the carbon material layer 22 to a temperature higher than 36° C., the carbon material layer 22 is able to emit far infrared rays. The external energy 30 can be an electric source 30a, as shown in FIG. 12, or a light source 30b, as shown in FIG. 13.

Figure 7:
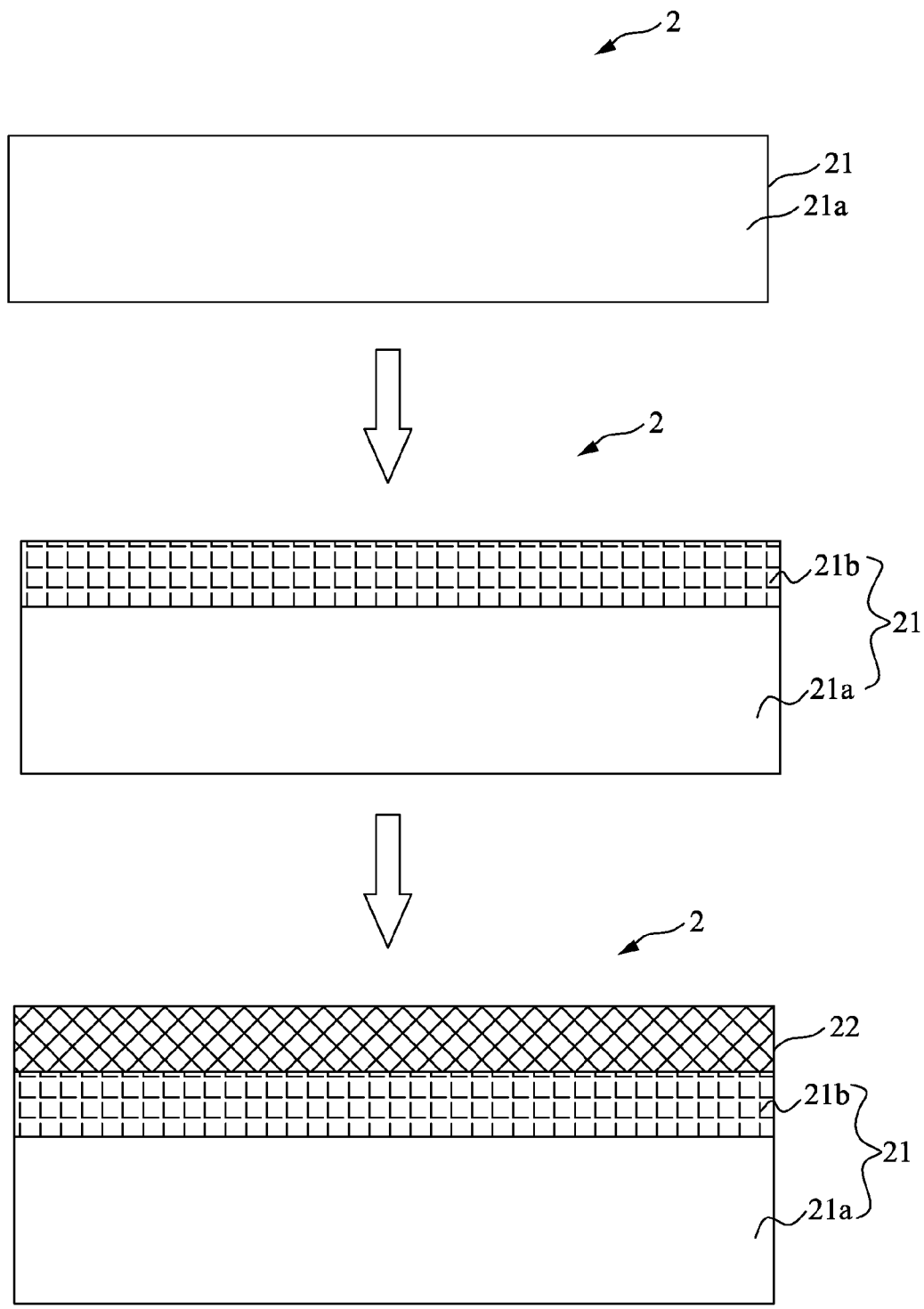
FIG. 7 is a pictorial description of the steps shown in FIG. 6.

Referring to FIGS. 6 and 7, which are flowchart and pictorial description, respectively, of steps included in an operable variant of the first embodiment of the manufacturing method provided according to the present invention. As shown, the variant is different from the first embodiment in that the step (A) for the first embodiment now includes two sub-steps: providing an insulation substrate 21a; and forming a layer of bonding material 21b on a surface of the insulation substrate 21a by sputter deposition or vapor deposition, so that the insulation substrate 21a and the bonding material 21b together form the substrate layer 21; wherein the bonding material 21b can be at least one metal material selected from the group consisting of titanium, nickel and chrome and any alloy thereof, or can be an adhesive. Since all other aspects of the variant are the same as the first embodiment, they are not repeatedly described herein.

Figure 9:
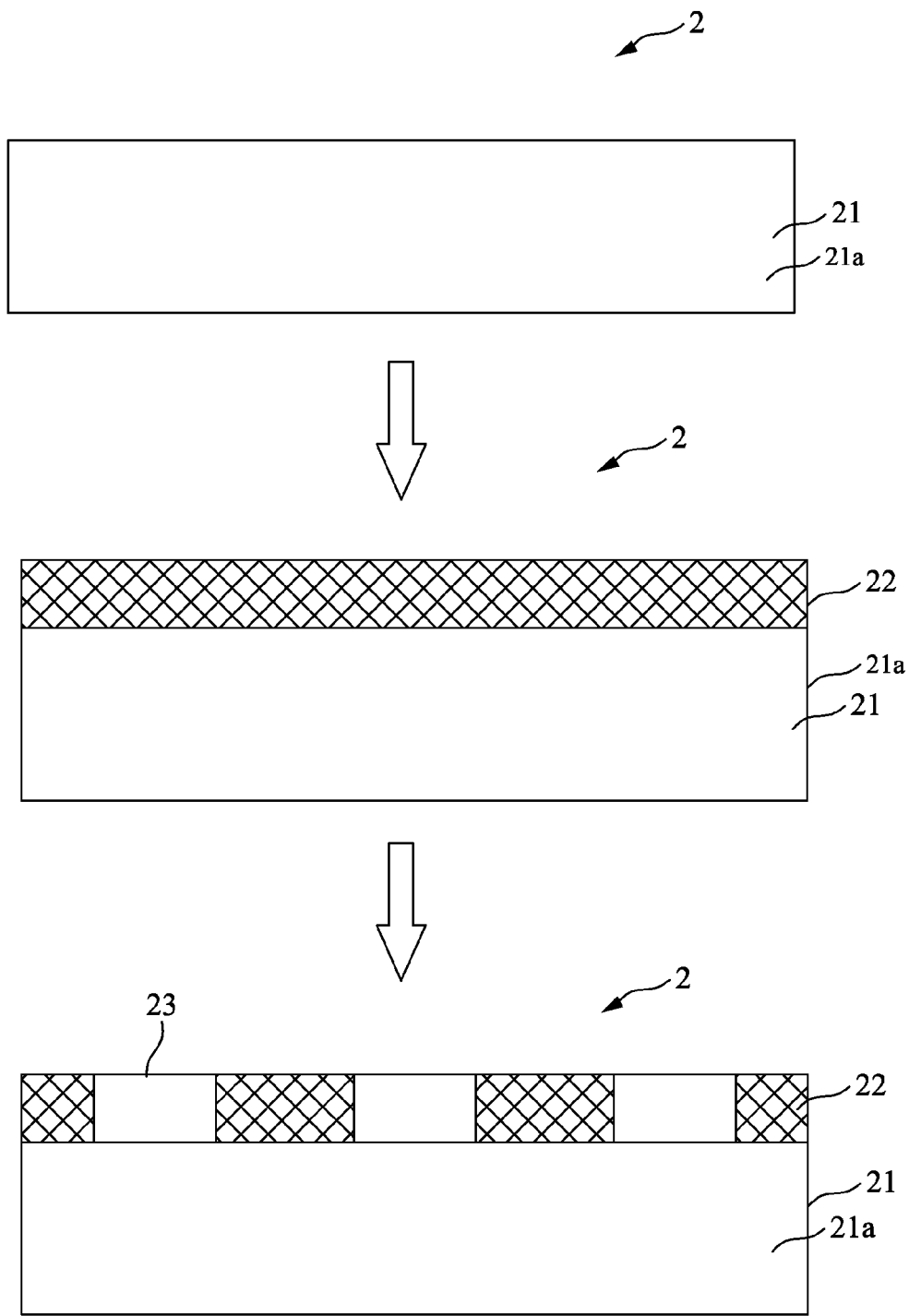
FIG. 9 is a pictorial description of the steps shown in FIG. 8.

FIGS. 8 and 9 are flowchart and pictorial description, respectively, of steps included in a second embodiment of the manufacturing method according to the present invention. In a first step of the second embodiment, a substrate layer 21 is formed; and in a second step a carbon material layer 22 is formed on a surface of the substrate layer 21; and then, in a third step, in the event the carbon material layer 22 formed on the substrate layer 21 has a sheet resistance value smaller than 0.01Ω/□, a hole forming process is performed to form at least one hole 23 on the carbon material layer 22 in order to increase the sheet resistance value of the carbon material layer 22 to a range between 0.01 and 1000Ω/□. Then, when an amount of external energy 30 is applied to heat the carbon material layer 22 to a temperature higher than 36° C., the carbon material layer 22 is able to emit far infrared rays. The external energy 30 can be an electric source 30a, as shown in FIG. 12, or a light source 30b, as shown in FIG. 13.

The hole forming process can be ultrasonic machining, electron beam machining, laser machining, hydraulic punching, conventional drilling, plastic hole forming, or chemical etching.

Figure 10:
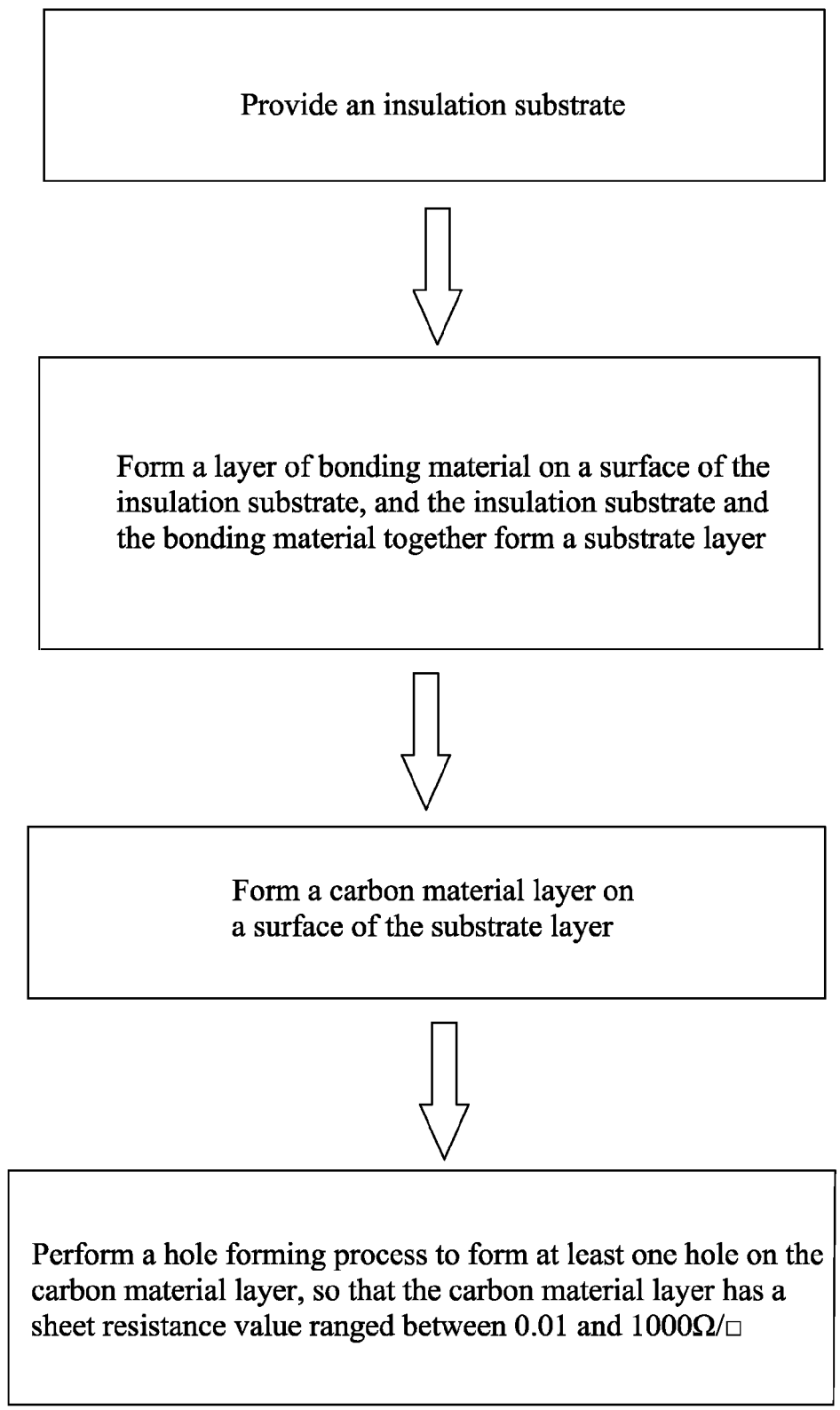
FIG. 10 is a flowchart showing the steps included in a variant of the second embodiment of the method of manufacturing infrared surface light source generating device according to the present invention.
Figure 11:
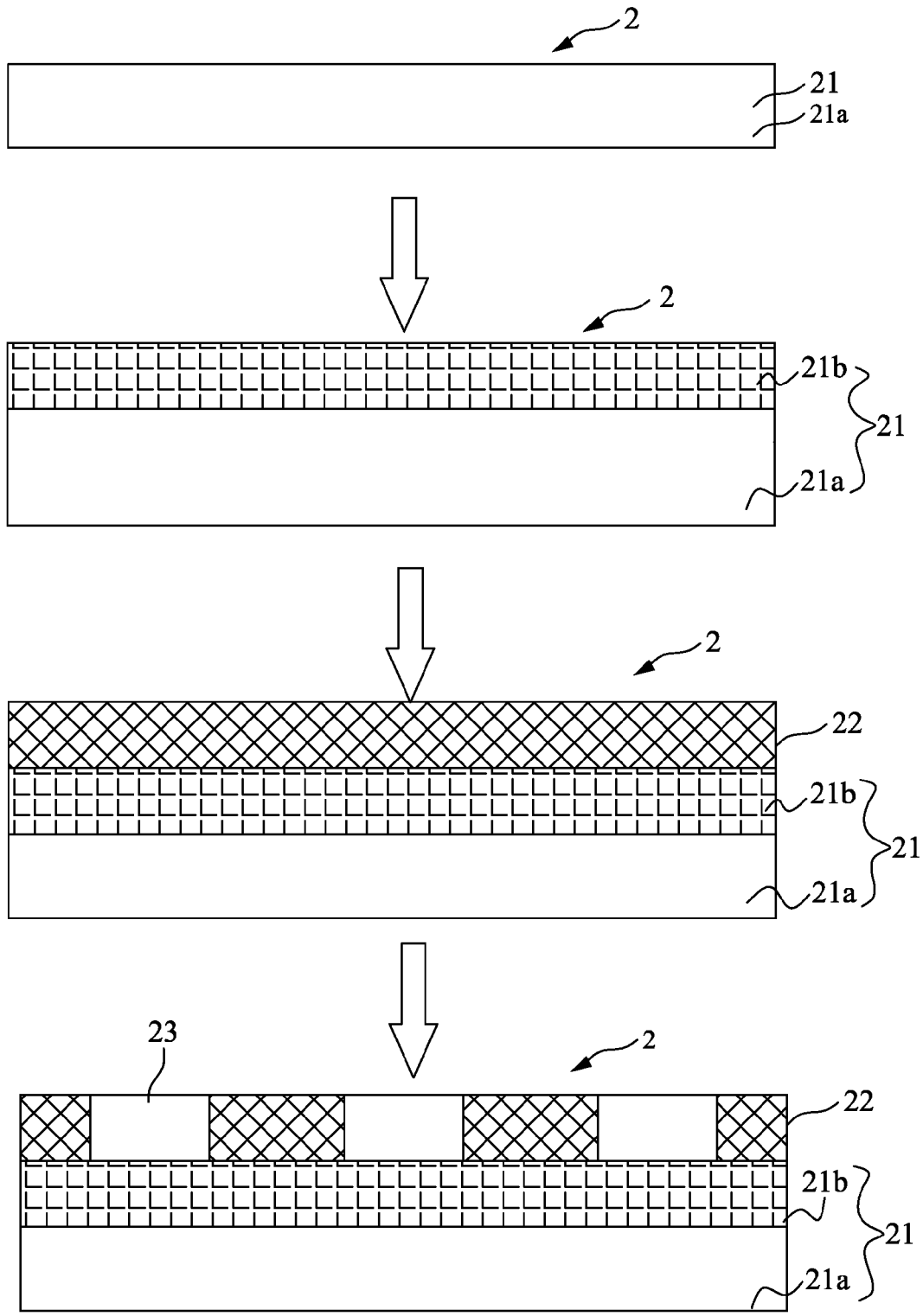
FIG. 11 is a pictorial description of the steps shown in FIG. 10.

Referring to FIGS. 10 and 11, which are flowchart and pictorial description, respectively, of steps included in an operable variant of the second embodiment of the manufacturing method provided according to the present invention. As shown, the variant is different from the second embodiment in that the step (A) for the second embodiment now includes two sub-steps: providing an insulation substrate 21a; and forming a layer of bonding material 21b on a surface of the insulation substrate 21a, so that the insulation substrate 21a and the bonding material 21b together form the substrate layer 21. Wherein the bonding material 21b can be at least one metal material selected from the group consisting of titanium, nickel and chrome and any alloy thereof, or can be an adhesive. Since all other aspects of the variant are the same as the second embodiment, they are not repeatedly described herein.

To use the infrared surface light source generating device 2 of the present invention, first apply an amount of external energy 30 to it. FIG. 12 illustrates the external energy 30 is an electric source 30a, which can be alternating current or direct current. More specifically, the device 2 is first connected to positive and negative electrodes of the external electric source 30a, so that electric current is supplied to the device 2. When the electric current from the external electric source 30a flows through the carbon material layer 22, the carbon material layer 22 is heated due to the resistance of the layer 22 to the electric current. When the carbon material layer 22 is heated to a temperature higher than 36° C., it will emit far infrared rays.

FIG. 13 illustrates the external energy 30 is a light source 30b, which can be a lamp or sunlight. When the device 2 is irradiated by the light source 30b, light passes through the substrate layer 21, which is the insulation substrate 21a, and heat of the light source 30b is transferred to the carbon material layer 22. When the carbon material layer 22 is heated to a temperature higher than 36° C., it will emit far infrared rays.

Figure 14:
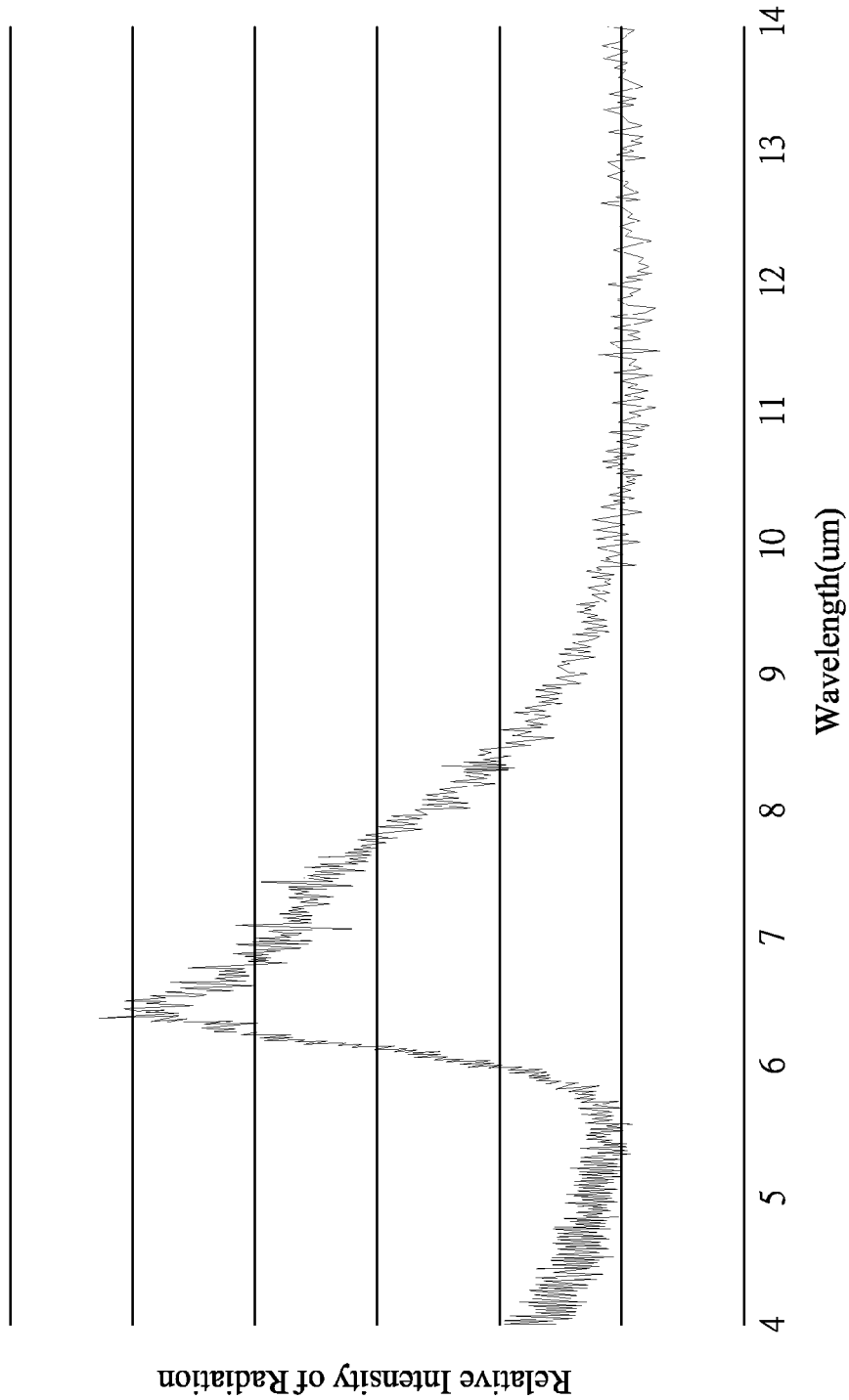
FIG. 14 shows the far infrared spectrum produced by one embodiment of the infrared surface light source generating device of the present invention.
Figure 15:
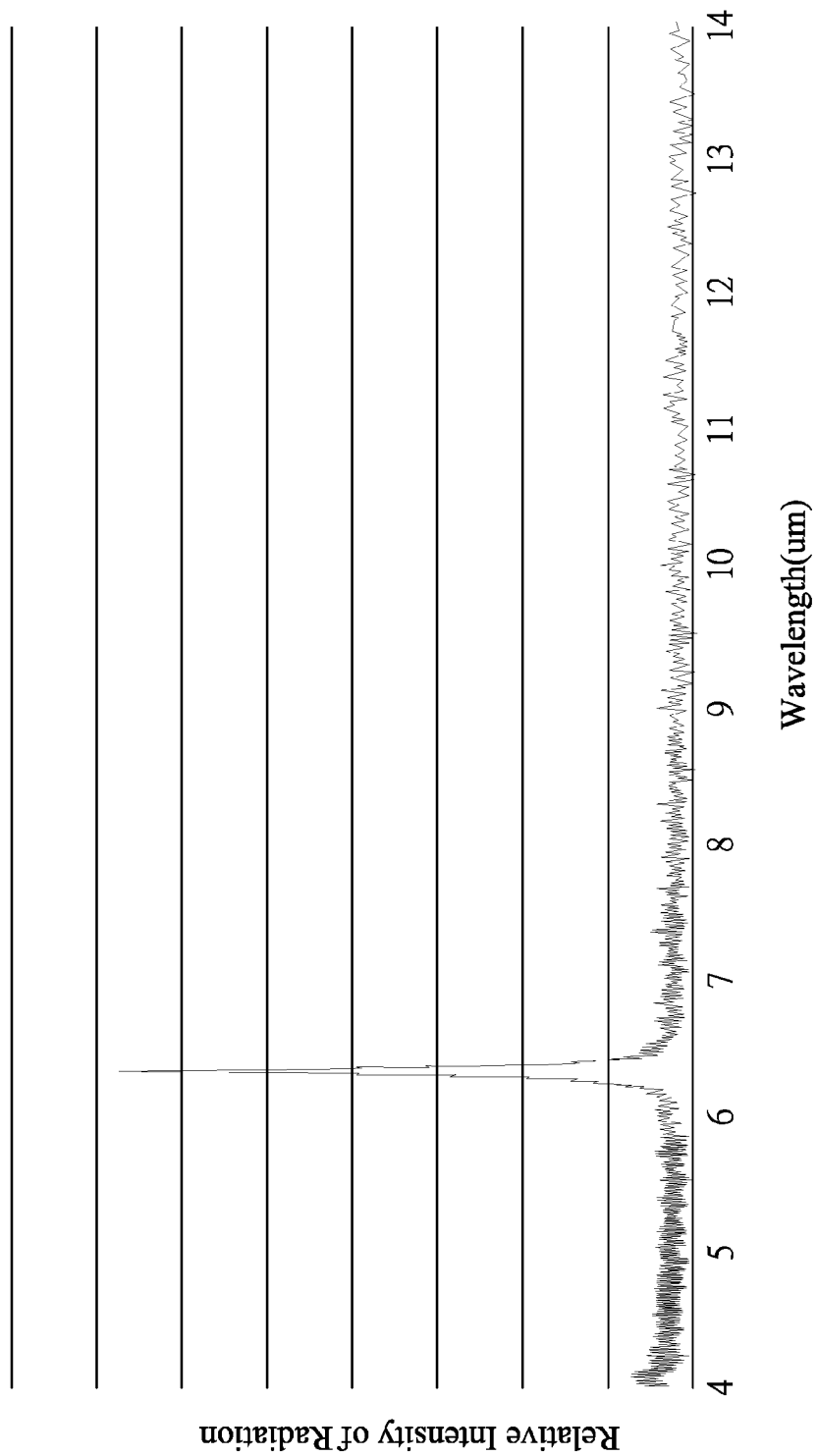
FIG. 15 shows the far infrared spectrum produced by another embodiment of the infrared surface light source generating device of the present invention.

FIG. 14 shows a far infrared radiation spectrum produced by the infrared surface light source generating device 2 according to the first embodiment of the present invention. In this embodiment, the carbon material layer 22 of the device 2 is formed through sputter deposition and has a thickness smaller than 1 μm. FIG. 15 shows a far infrared radiation spectrum produced by the device 2 according to the second embodiment of the present invention. In this embodiment, the carbon material layer 22 of the device 2 is formed by laminating a graphite sheet to the surface of the substrate layer 21 and has a thickness larger than 1 μm with holes 23 formed thereon.

FIGS. 3A and 3B show the infrared surface light source generating device 2 of the present invention, of which the substrate layer 21 has a bonding material 21b in the form of an adhesive applied to a surface thereof and the carbon material layer 22 is a graphite sheet laminated to the surface of the substrate layer 21 via the bonding material 2b. As can be seen in FIG. 3B, a plurality of differently sized holes 23 are formed in the carbon material layer 22 through the chemical etching process.

The present invention is characterized in that the device 2 does not require any additional electrical heating element or heating device and the carbon material layer 22 thereof is able to emit far infrared rays when it is heated by an amount of external energy 30 to a temperature above 36° C. Further, the carbon material layer 22 provides an infrared surface light source that provides an increased irradiation surface, compared to a linear or a spot light source. The present invention also provides a method for manufacturing the above-described device 2 through a simplified process and using easily available materials, so that the manufacturing method according to the present invention has wide applicability in the industrial field.

The present invention has been described with some preferred embodiments thereof and it is understood that many changes and modifications in the described embodiments can be carried out without departing from the scope and the spirit of the invention that is intended to be limited only by the appended claims.

What is claimed is:

1. An infrared surface light source generating device, comprising a substrate layer and a carbon material layer; the carbon material layer being a graphite sheet and being formed on a surface of the substrate layer and having a sheet resistance value ranging between 0.01 and 1000Ω/□; such that the carbon material layer is able to emit far infrared rays when being heated by an amount of external energy applied thereto, wherein the graphite sheet has a thickness smaller than 1 μm or is formed with at least one hole therein to obtain the sheet resistance value ranging between 0.01 and 1000Ω/□.

2. The infrared surface light source generating device as claimed in claim 1, wherein the substrate layer is selected from the group consisting of an insulation substrate and a combination of an insulation substrate and a layer of bonding material.

3. The infrared surface light source generating device as claimed in claim 2, wherein the bonding material is selected from the group consisting of at least one metal material and an adhesive; and the at least one metal material is selected from the group consisting of titanium, nickel, chrome, and any alloy thereof.

4. A method of manufacturing infrared surface light source generating device, comprising the following steps:
   (A) forming a substrate layer; and
   (B) forming a carbon material layer on a surface of the substrate layer, the carbon material layer being a graphite sheet and having a sheet resistance value ranging between 0.01 and 1000Ω/□, wherein the graphite sheet has a thickness smaller than 1 μm or is subjected to a hole forming process to form at least one hole therein to obtain the sheet resistance value ranging between 0.01 and 1000Ω/□.

5. The method as claimed in claim 4, wherein the step (A) further includes the following sub-steps:
   providing an insulation substrate; and
   forming a layer of bonding material on a surface of the insulation substrate, the insulation substrate and the bonding material together forming the substrate layer.

6. The method as claimed in claim 5, wherein the bonding material is selected from the group consisting of at least one metal material and an adhesive; and the at least one metal material is selected from the group consisting of titanium, nickel, chrome, and any alloy thereof.

7. The method as claimed in claim 4, wherein the hole forming process is selected from the group consisting of ultrasonic machining, electron beam machining, laser machining, hydraulic punching, conventional drilling, plastic hole forming, and chemical etching.

8. The method as claimed in claim 4, wherein the carbon material layer is formed through a process selected from the group consisting of sputter deposition, vacuum vapor deposition, plasma chemical vapor deposition, and graphite sheet lamination.

\* \* \* \* \*